(12) United States Patent
Shiba et al.

(10) Patent No.: US 10,992,285 B2
(45) Date of Patent: Apr. 27, 2021

(54) GROUP DELAY COMPENSATION FILTER

(71) Applicant: FUJITSU LIMITED, Kawasaki (JP)

(72) Inventors: Shoichi Shiba, Atsugi (JP); Toshiaki Nagai, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 55 days.

(21) Appl. No.: 16/655,427

(22) Filed: Oct. 17, 2019

(65) Prior Publication Data

US 2020/0144994 A1 May 7, 2020

(30) Foreign Application Priority Data

Nov. 7, 2018 (JP) .............................. JP2018-210000

(51) Int. Cl.
*H01P 1/207* (2006.01)
*H01P 1/208* (2006.01)
*H03H 11/26* (2006.01)
*H01P 7/06* (2006.01)
*H01P 1/209* (2006.01)

(52) U.S. Cl.
CPC ............. *H03H 11/26* (2013.01); *H01P 1/209* (2013.01); *H01P 7/06* (2013.01)

(58) Field of Classification Search
CPC ......... H01P 1/207; H01P 1/208; H01P 1/2084
See application file for complete search history.

(56) References Cited

U.S. PATENT DOCUMENTS 4,630,009 A * 12/1986 Tang .................. H01P 1/2082
333/212
5,804,534 A * 9/1998 Zaki .................. H01P 1/2086
333/202

FOREIGN PATENT DOCUMENTS

| JP | 57-141101 | 9/1982 |
| JP | 58-46701 | 3/1983 |
| JP | 2002-50908 | 2/2002 |
| JP | 2006-345340 | 12/2006 |

* cited by examiner

*Primary Examiner* — Dean O Takaoka
(74) *Attorney, Agent, or Firm* — Fujitsu Patent Center

(57) ABSTRACT

A group delay compensation filter includes: a waveguide that has a first slot and that is configured to transmit a signal; and a first dielectric resonator that includes: a first dielectric, a first metal layer formed over a surface of the first dielectric, and a first opening provided in the first metal layer, wherein the first dielectric resonator is in contact with the waveguide with the first opening coupled to the first slot, and wherein the first dielectric resonator is configured to compensate group delay in a first frequency band of the signal.

8 Claims, 14 Drawing Sheets

+

=

GROUP DELAY COMPENSATION FILTER

CROSS-REFERENCE TO RELATED APPLICATION

This application is based upon and claims the benefit of priority of the prior Japanese Patent Application No. 2018-210000, filed on Nov. 7, 2018, the entire contents of which are incorporated herein by reference.

FIELD

The embodiment discussed herein is related to a group delay compensation filter.

BACKGROUND

A waveguide microwave circuit or a waveguide millimeter wave circuit is provided.

The related art is disclosed in Japanese Laid-open Patent Publication No. 2002-050908.

SUMMARY

According to an aspect of the embodiments, a group delay compensation filter includes: a waveguide that has a first slot and that is configured to transmit a signal; and a first dielectric resonator that includes: a first dielectric, a first metal layer formed over a surface of the first dielectric, and a first opening provided in the first metal layer, wherein the first dielectric resonator is in contact with the waveguide with the first opening coupled to the first slot, and wherein the first dielectric resonator is configured to compensate group delay in a first frequency band of the signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

For example, a waveguide microwave circuit or a waveguide millimeter wave circuit that includes a main waveguide, sub-waveguide, and an adjuster may be provided. The main waveguide has a coupling hole in a wall thereof. The sub-waveguide is electromagnetically coupled to the main waveguide through the coupling hole of the main waveguide. The adjuster is provided in the wall of the main waveguide so as to project at a portion of the waveguide near the coupling hole of the waveguide, thereby adjusting the electromagnetic coupling.

However, the waveguide microwave circuit or millimeter wave circuit may not compensate group delay.

For example, a group delay compensation filter able to compensate group delay may be desired.

Hereinafter, an embodiment to which a group delay compensation filter is applied will be described.

Embodiment

Figure 1:
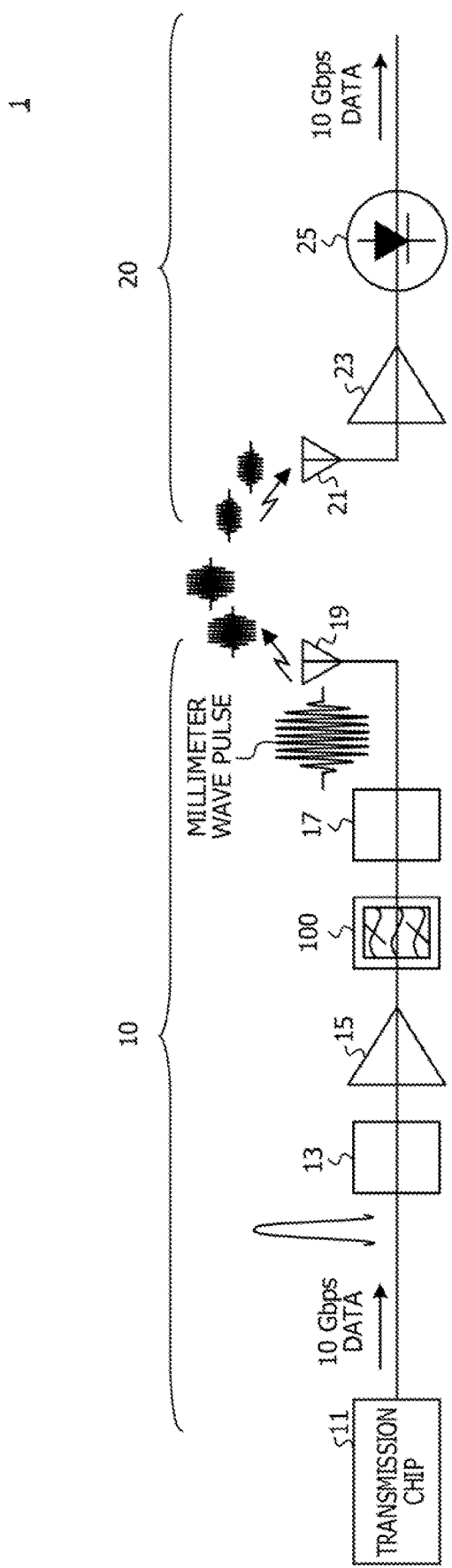
FIG. 1 is a diagram illustrating a communication system including a group delay compensation filter according to an embodiment.

FIG. 1 is a diagram illustrating a communication system 1 including a group delay compensation filter 100 according to an embodiment. The communication system 1 includes a radio transmitter 10 and a receiver 20.

The radio transmitter 10 includes a transmission chip 11, a band-pass filter 13, a transmission amplifier 15, a band-pass filter 17, a group delay compensation filter 100, and an antenna 19. The transmission chip 11 is a computer (chip set) that outputs transmission data. The communication speed of the transmission data is, for example, 10 Gbps. The transmission chip 11 employs an impulse radio system incorporating a short pulse generator and outputs a transmission signal to the band-pass filter 13.

The band-pass filter 13 has a predetermined pass band in the millimeter wave band, transmits millimeter wave band components (millimeter wave pulses) included in the transmission signal input from the transmission chip 11, and outputs the millimeter wave band components to the transmission amplifier 15.

The transmission amplifier 15 amplifies the transmission signal input from the band-pass filter 13 and outputs the amplified signal to the group delay compensation filter 100. The transmission amplifier 15 is a so-called power amplifier (PA). The group delay compensation filter 100 compensates group delay included in the transmission signal of the millimeter wave band output from the transmission amplifier 15 and outputs the transmission signal of the millimeter wave band to the band-pass filter 17.

The band-pass filter 17 has a predetermined pass band in the millimeter wave band, transmits the millimeter wave band components (millimeter wave pulses) included in the transmission signal input from the group delay compensation filter 100, and outputs the millimeter wave band components to the antenna 19.

The antenna 19 emits the transmission signal input from the band-pass filter 17. The emitted transmission signal is received by an antenna 21 of the receiver 20.

The receiver 20 includes the antenna 21, a reception amplifier 23, and a detector 25. The signal received by the antenna 21 (received signal) is amplified by the reception amplifier 23, and the received data is extracted by the detector 25. The received data is equal to the transmission data.

Figure 2A:
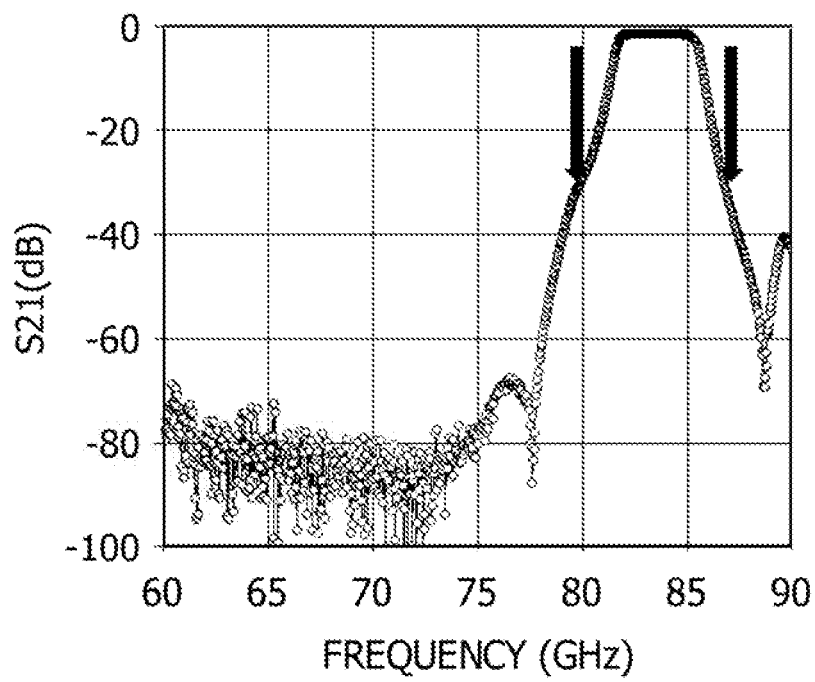
FIGS. 2A and 2B are diagrams illustrating a transmission characteristic and a group delay characteristic of a band-pass filter.
Figure 2B:
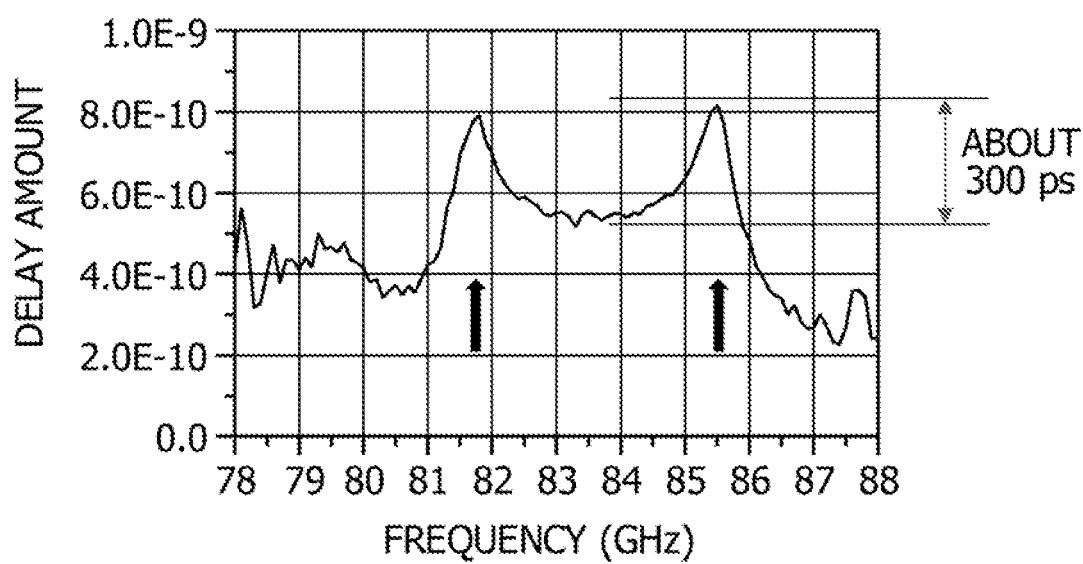

FIGS. 2A and 2B are diagrams illustrating a transmission characteristic and a group delay characteristic of the band-pass filter 13. In FIG. 2A, the horizontal axis represents the frequency (GHz) and the vertical axis represents the S21 parameter (dB). In FIG. 2B, the horizontal axis represents the frequency (GHz), and the vertical axis represents the delay amount (delay time).

As illustrated in FIG. 2A, the pass band of the band-pass filter 13 is, for example, 81.8 to 85.4 GHz and, as indicated by two arrows, the S21 parameter is characterized by steep reduction on both sides of the pass band.

FIG. 2B illustrates the group delay characteristic included in the signal transmitted through the band-pass filter 13. As illustrated in FIG. 2B, with the band-pass filter 13, a large group delay is generated at both ends of the pass band. Compared to a band at a central portion of the pass band, the delay amount of the group delay generated at both ends of the pass band is about 300 ps. In this way, with the band-pass filter 13, the group delay of about 300 ps is generated at both ends of the pass band.

Figure 3A:
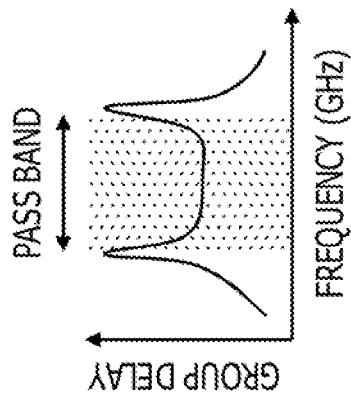
FIGS. 3A to 3C are diagrams illustrating group delay compensation characteristic with the group delay compensation filter according to the embodiment.
Figure 3B:
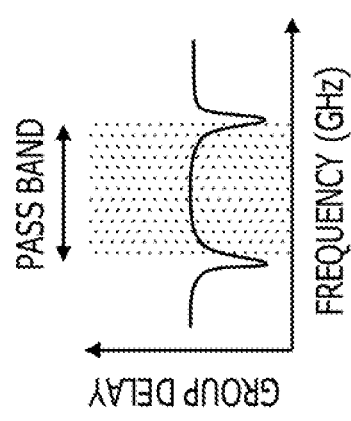
Figure 3C:
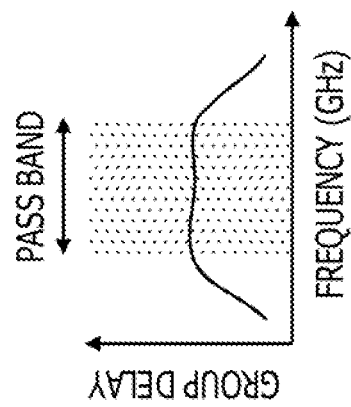

FIGS. 3A to 3C are diagrams illustrating group delay compensation characteristics with the group delay compensation filter 100 according to the embodiment. FIG. 3A illustrates a group delay characteristic of a transmission signal input to the group delay compensation filter 100. The group delay characteristic illustrated in FIG. 3A corresponds to the group delay characteristic illustrated in FIG. 2B.

The group delay compensation characteristic with the group delay compensation filter 100 according to the embodiment has the group delay characteristic as illustrated in FIG. 3B. The group delay characteristic illustrated in FIG. 3B is characterized by inversion of the positivity/negativity values of the group delay characteristic illustrated in FIG. 3A and indicates a negative group delay. Here, the negative group delay means that the amount of the group delay is negative (minus) and has a characteristic having a minimum value as illustrated in FIG. 3B.

The group delay compensation filter 100 according to the embodiment is configured such that a configuration for realizing the group delay compensation characteristic is added to the rectangular waveguide. The group delay compensation filter 100 according to the embodiment combines the group delay characteristic illustrated in FIG. 3A with the group delay characteristic illustrated in FIG. 3B, thereby realizing a group delay characteristic having a flattened group delay within the pass band as illustrated in FIG. 3C.

Figure 4:
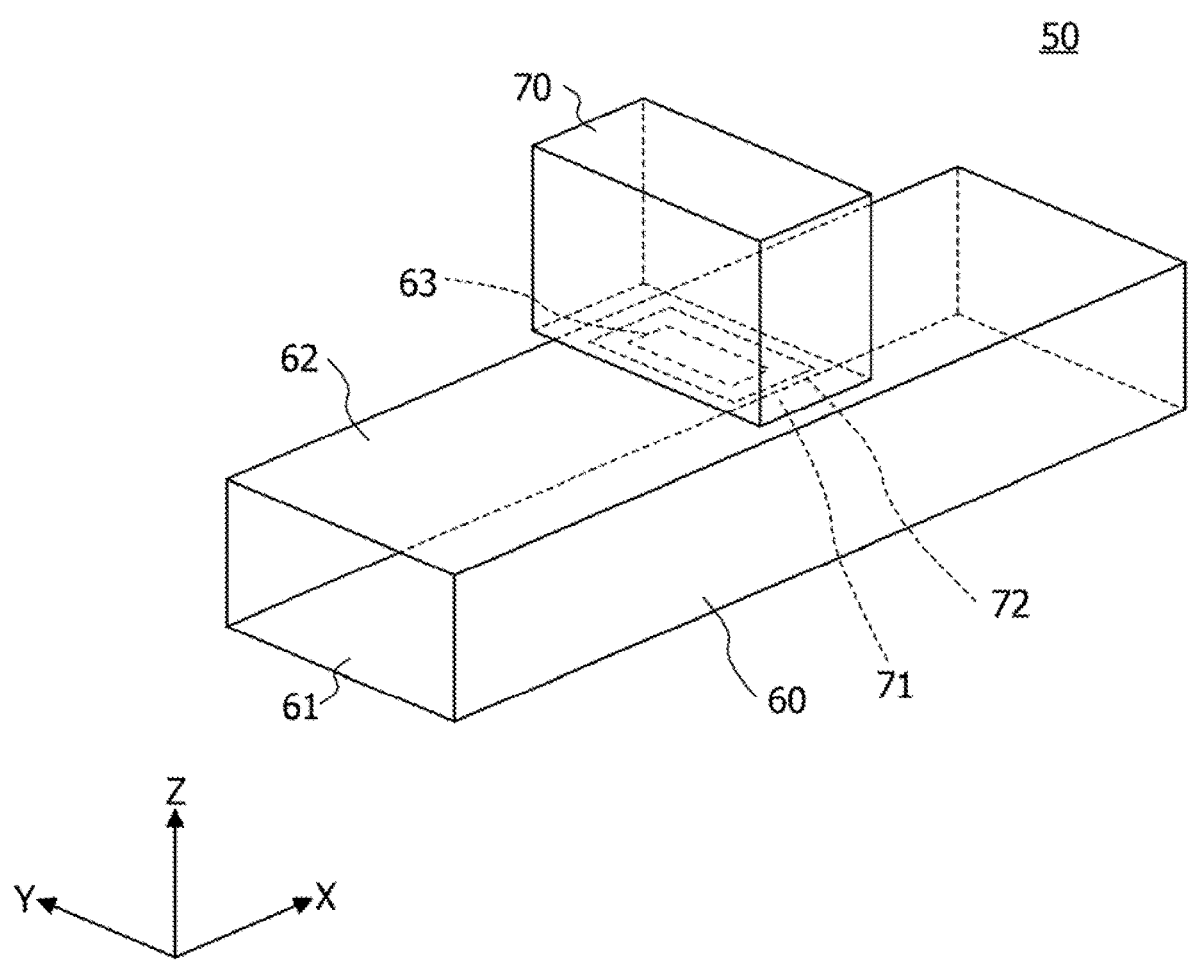
FIG. 4 is a diagram illustrating a comparative group delay compensation filter.

FIG. 4 is a diagram illustrating a comparative transmission filter 50. In FIG. 4, the XYZ coordinate system is defined as illustrated therein. The transmission filter 50 includes a waveguide 60 and a cavity resonator 70.

The waveguide 60 is a metal rectangular waveguide having a waveguide axis extending in the X-axis direction. The waveguide 60 has openings 61 at both ends in the X-axis direction (the opening 61 on the X-axis positive side behind the waveguide 60 in FIG. 4 is not seen in FIG. 4). One of the opening 61 is coupled to the band-pass filter 13 (see FIG. 1) and the other opening 61 is coupled to the transmission amplifier 15. A transmission signal having the group delay characteristic as illustrated in FIG. 3A is input to the one opening 61 of the waveguide 60. The waveguide 60 transmits millimeter waves in the transverse electric (TE) mode.

Furthermore, the waveguide 60 has a slot 63 formed in a wall portion 62 on the positive side in the Z-axis direction. The slot 63 is a rectangular opening that penetrates through the wall portion 62 in XY plan view. For example, the slot 63 is an elongated opening having the longitudinal direction in the Y-axis direction and the lateral direction in the X-axis direction. However, the slot 63 does not necessarily have the above-described shape and may have a circular shape or the like.

The cavity resonator 70 is formed of metal and has a rectangular parallelepiped shape having a hollow therein-side. The cavity resonator 70 has an opening 72 provided in a wall portion 71 on the negative side in the Z-axis direction. For example, the opening 72 is larger than the slot 63 in plan view. The length of the cavity resonator 70 in the Z-axis direction is about ½ of an electrical length $\lambda e$ of a wavelength $\lambda$ ($\lambda e/2$) at the resonance frequency of the cavity resonator 70.

The cavity resonator 70 is disposed on the wall portion 62 of the waveguide 60 such that the surface of the cavity resonator 70 on the negative side in the Z-axis direction covers the slot 63 and the opening 72 is superposed on the slot 63 in XY plan view. In this state, the slot 63 and the opening 72 are electromagnetically coupled to each other.

Figure 5A:
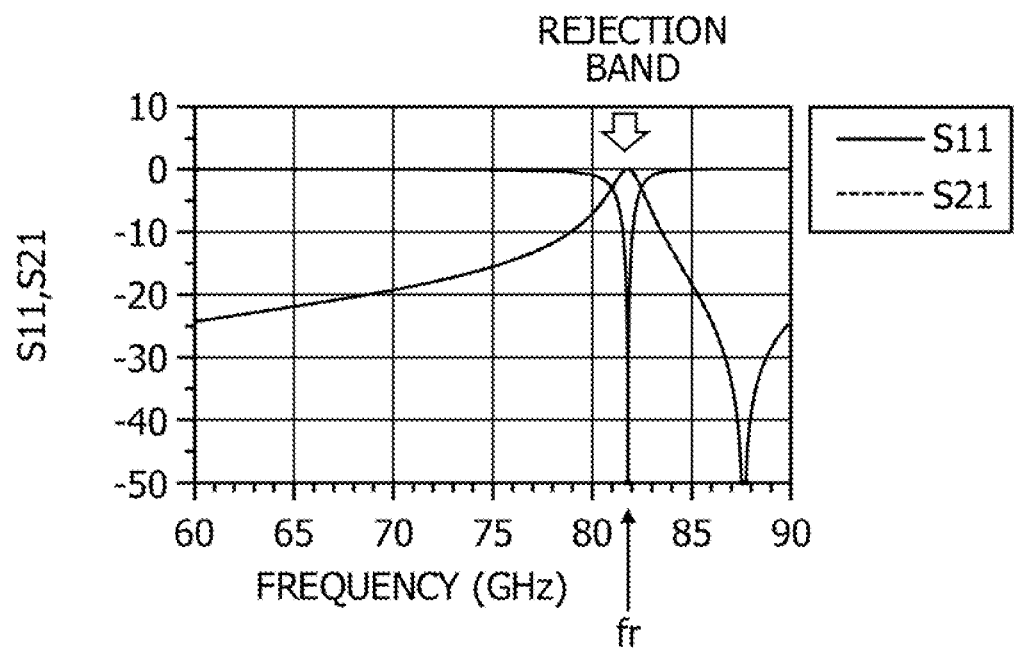
FIGS. 5A and 5B are diagrams illustrating results of electromagnetic field simulation of the transmission filter.
Figure 5B:
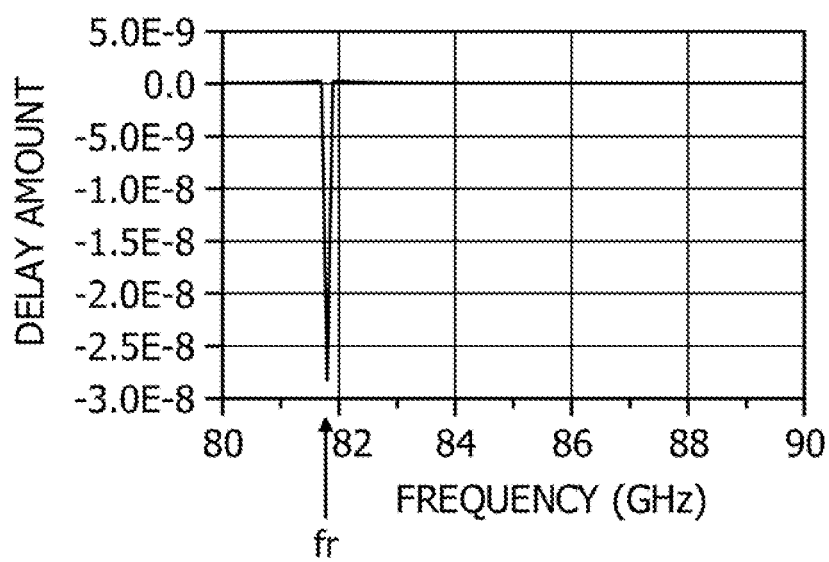

FIGS. 5A and 5B are diagrams illustrating results of electromagnetic field simulation of the transmission filter 50. FIG. 5A is a diagram illustrating a frequency characteristic of an S11 parameter (solid line) and an S21 parameter (broken line) of the transmission filter 50. The horizontal axis represents the frequency (GHz), and the vertical axis represents the level (dB) of the S11 parameter and the S21 parameter. Here, the resonance frequency fr of the cavity resonator 70 is 81.8 GHz. This frequency corresponds to a lower end of both the ends of the pass band (see FIG. 2A) of the band-pass filter 13 (see FIG. 1).

As illustrated in FIG. 5A, in terms of the resonance frequency fr, a maximum value of the S11 parameter and a minimum value of the S21 parameter are obtained. Thus, it is understood that the transmission filter 50 has a rejection band (stop band) the center of which is the resonance frequency fr. Accordingly, it is understood that the transmission filter 50 functions as a rejection band filter at the resonance frequency fr of the cavity resonator 70.

FIG. 5B illustrates a group delay characteristic of the transmission filter 50. In FIG. 5B, the horizontal axis represents the frequency (GHz) and the vertical axis represents the delay amount (delay time). As illustrated in FIG. 5B, it is understood that the transmission filter 50 exhibits negative group delay at the resonance frequency fr. Accordingly, with the cavity resonator 70, the group delay in the band of the resonance frequency fr is able to be reduced (compensated).

However, the negative group delay with the cavity resonator 70 is as large as about $1 \times 10^{-8}$ (=10 ns), for example, excessively large to compensate the group delay illustrated in FIG. 2B (about 300 ps). One of the causes of this is that the quality factor (Q factor) of the cavity resonator 70 is comparatively large.

Optimization of the group delay compensation characteristic in the group delay compensation filter 100 according to the embodiment will be described below.

Figure 6:
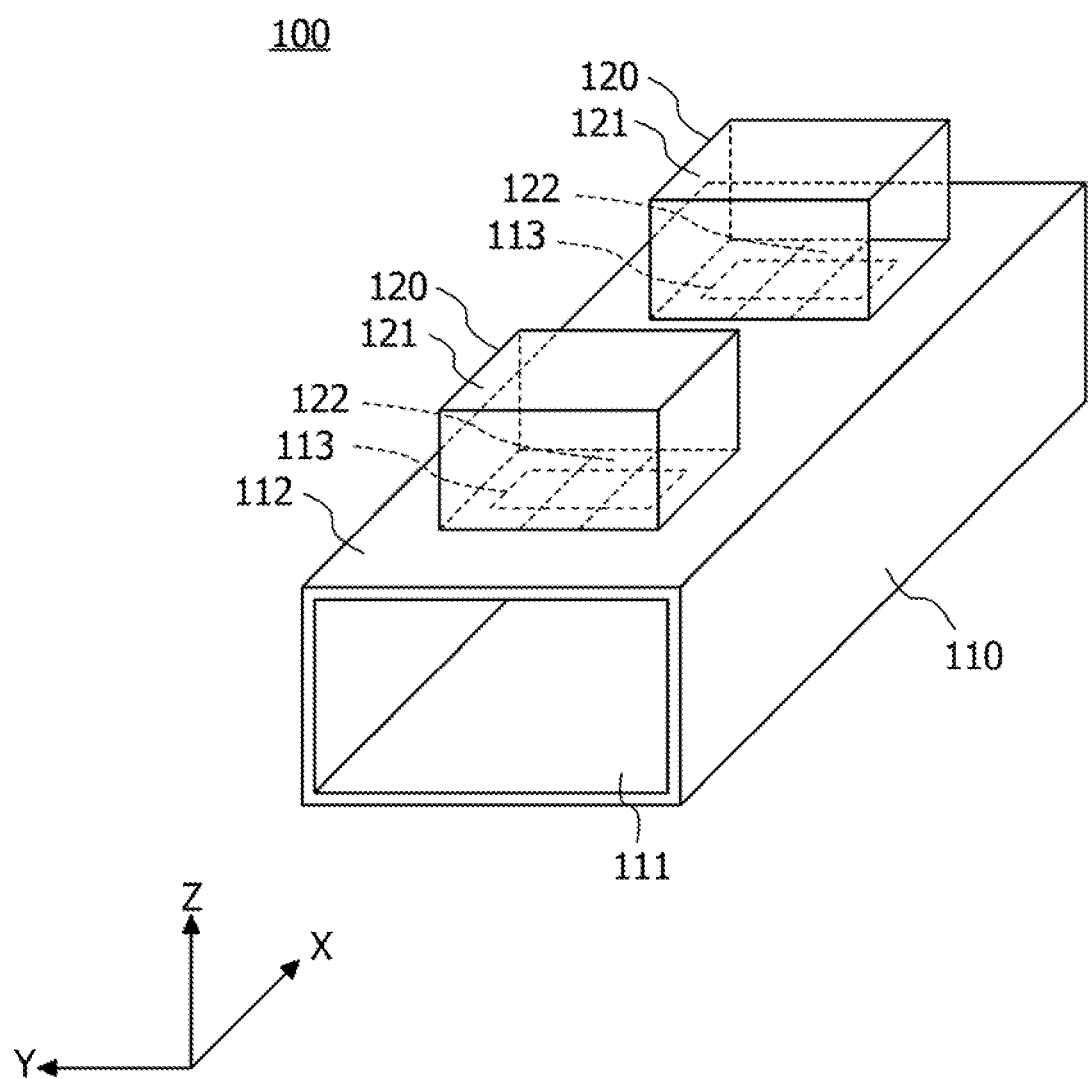
FIG. 6 is a diagram illustrating the group delay compensation filter according to the embodiment.

FIG. 6 is a diagram illustrating the group delay compensation filter 100 according to the embodiment. In FIG. 6, the XYZ coordinate system is defined as illustrated therein. The group delay compensation filter 100 includes a waveguide 110 and dielectric resonators 120. The group delay compensation filter 100 optimizes the compensation for the group delay characteristic by using the dielectric resonators 120 having a lower Q factor than that of the cavity resonator 70 (see FIG. 4).

Figure 7:
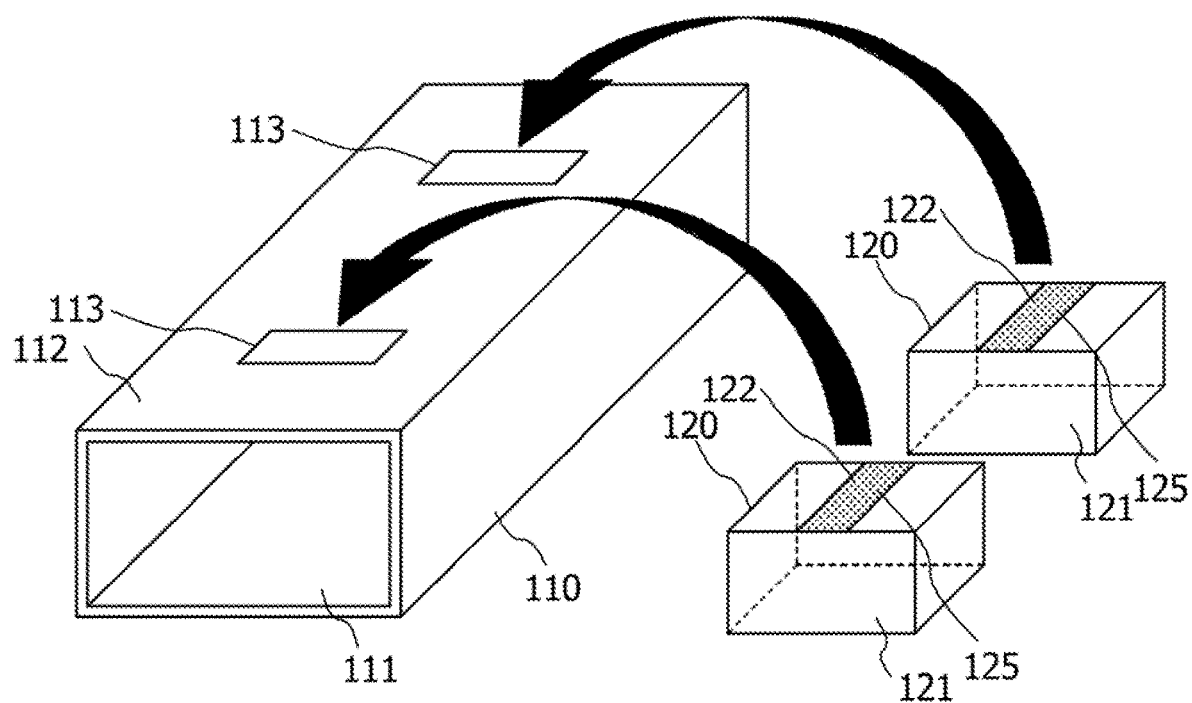
FIG. 7 is a diagram in which a waveguide and dielectric resonators are separately illustrated.

Here, description will be made by referring to FIG. 7 in addition to FIG. 6. FIG. 7 is a diagram in which the waveguide 110 and the dielectric resonators 120 are separately illustrated. FIG. 7 illustrates the dielectric resonators 120 upside down.

The waveguide 110 is a metal rectangular waveguide having a waveguide axis extending in the X-axis direction. The waveguide 110 has openings 111 at both ends in the X-axis direction (the opening 111 on the X-axis positive side behind the waveguide 110 in, for example, FIG. 6 is not seen in FIG. 6). One of the openings 111 is coupled to the band-pass filter 13 (see FIG. 1) and the other opening 111 is coupled to the transmission amplifier 15. The waveguide 110 transmits microwaves in the TE mode. A transmission signal having the group delay characteristic as illustrated in FIG. 3B is input to one opening 111.

Furthermore, the waveguide 110 has two slots 113 formed in a wall portion 112 on the positive side in the Z-axis direction. Each of the slots 113 is a rectangular opening that penetrates through the wall portion 112 in XY plan view. The slot 113 is an elongated opening having the longitudinal direction in the Y-axis direction and the lateral direction in the X-axis direction. Two slots 113 are spaced from each other in the waveguide axis direction of the waveguide 110 at a predetermined interval. Out of two slots 113, one of the slots 113 is an example of a first slot, and the other slot 113 is an example of a second slot.

Two dielectric resonators 120 are provided corresponding to two slots 113. Each of the dielectric resonators 120 has a structure in which, on surfaces (all the six surfaces) of a rectangular parallelepiped dielectric 125, an opening 122 is formed in a metal plated layer 121 by forming a metal plated layer 121 at portions other than the opening 122.

Out of two dielectric resonators 120, one of the dielectric resonators 120 is an example of a first dielectric resonator. In the one dielectric resonator 120, the metal plated layer 121 is an example of a first metal layer, and the opening 122 is an example of a first opening. Likewise, out of two dielectric resonators 120, the other dielectric resonator 120 is an example of a second dielectric resonator. In the other dielectric resonator 120, the metal plated layer 121 is an example of a second metal layer, and the opening 122 is an example of a second opening.

The opening 122 is a part of the metal plated layer 121 on the surface on the negative side in the Z-axis direction. The length of the dielectric resonator 120 in the Z-axis direction corresponds to ½ of an electrical length λe of a wavelength λ (λe/2) at the resonance frequency of the dielectric resonator 120.

The term "length corresponding to ½ (λe/2) of the electric length λe" is not limited to a length equal to the electric length of half wavelength (λe/2). The term "length corresponding to ½ (λe/2) of the electric length λe" may be a length set to be slightly smaller or larger than the electric length of the half wavelength (λe/2) for adjustment of, for example, either or both of the resonance frequency and the Q factor of the dielectric resonator 120.

The opening 122 is, for example, a portion formed by removing a portion of the metal plated layer 121 of a predetermined width at a central portion in the Y-axis direction on the surface of the dielectric resonator 120 on the negative side in the Z-axis direction from an end portion on the negative side to an end portion on the positive side in the X-axis direction. The surface of the rectangular parallelepiped dielectric material of the dielectric resonator 120 is exposed from the opening 122 (see FIG. 7). The opening 122 is not necessarily removed from the end portion on the negative side to the end portion on the positive side in the X-axis direction. The length of the opening 122 may be smaller in the X-axis direction.

Accordingly, the dielectric resonator 120 is a cavity resonator in which portions other than the opening 122 are coated with the metal plated layer 121.

Each of the dielectric resonators 120 is disposed on the wall portion 112 of the waveguide 110 such that the surface of the dielectric resonator 120 on the negative side in the Z-axis direction covers a corresponding one of the slots 113 and the opening 122 is superposed on the slot 113 in XY plan view. For example, the dielectric resonator 120 is disposed on the waveguide 110 in a state in which the dielectric resonator 120 is inverted in the Z-axis direction relative to the waveguide 110 illustrated in FIG. 7 and the opening 122 is directed toward the negative side in the Z-axis direction. In this state, the slot 113 and the opening 122 are electromagnetically coupled to each other. For example, the dielectric resonator 120 is brought into contact with the waveguide 110 with the opening 122 coupled to the slot 133.

Here, in the group delay compensation filter 100, a coupling amount between the waveguide 110 and the dielectric resonator 120 is determined by the size of an opening formed between the waveguide 110 and the dielectric resonator 120 due to the superposition of the wall portion 112 and the opening 122 on each other. Accordingly, the coupling amount between the waveguide 110 and the dielectric resonator 120 is adjustable by preparing a plurality of dielectric resonators 120 the openings 122 of which are different in size and changing the dielectric resonators 120.

The group delay compensation filter 100 according to the embodiment optimizes the Q factor of the dielectric resonators 120 to compensate the group delay characteristic included in the transmission signal input from the band-pass filter 13.

It is sufficient that the waveguide 110 and the dielectric resonators 120 be secured by using, for example, a securing device or the like. Such a configuration will be described later with reference to FIG. 11.

Figure 8:
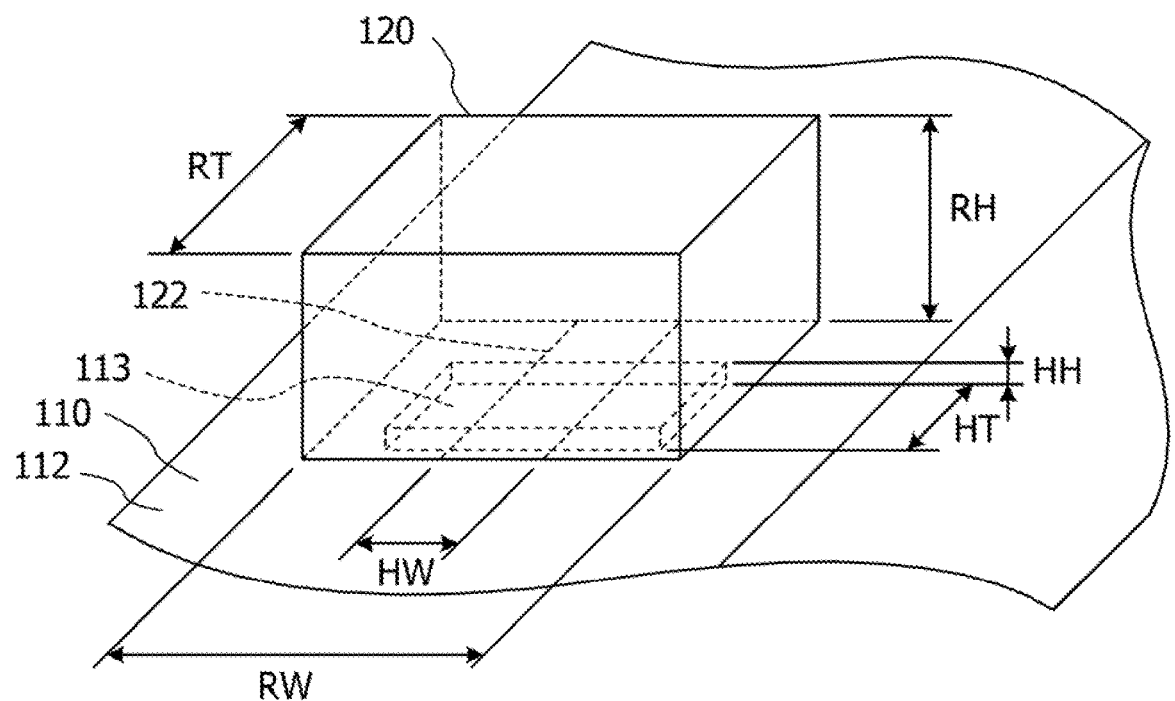
FIG. 8 is a diagram illustrating the dimensions of the dielectric resonator and a slot of the waveguide.
Figure 8:
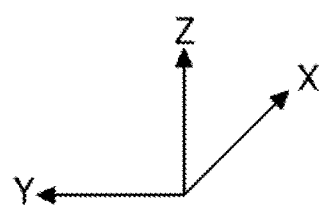

FIG. 8 is a diagram illustrating the dimensions of the dielectric resonator 120 and the slot 113 of the waveguide 110. It is assumed that the length of the slot 113 in the X-axis direction is HT, the length of the slot 113 in the Z-axis direction (thickness of the wall portion 112) is HH, and the length of the opening 122 in the Y-axis direction is HW. It is also assumed that the length of the dielectric resonator 120 in the X-axis direction is RT, the length of the dielectric resonator 120 in the Y-axis direction is RW, and the length of the dielectric resonator 120 in the Z-axis direction is RH.

Figure 9A:
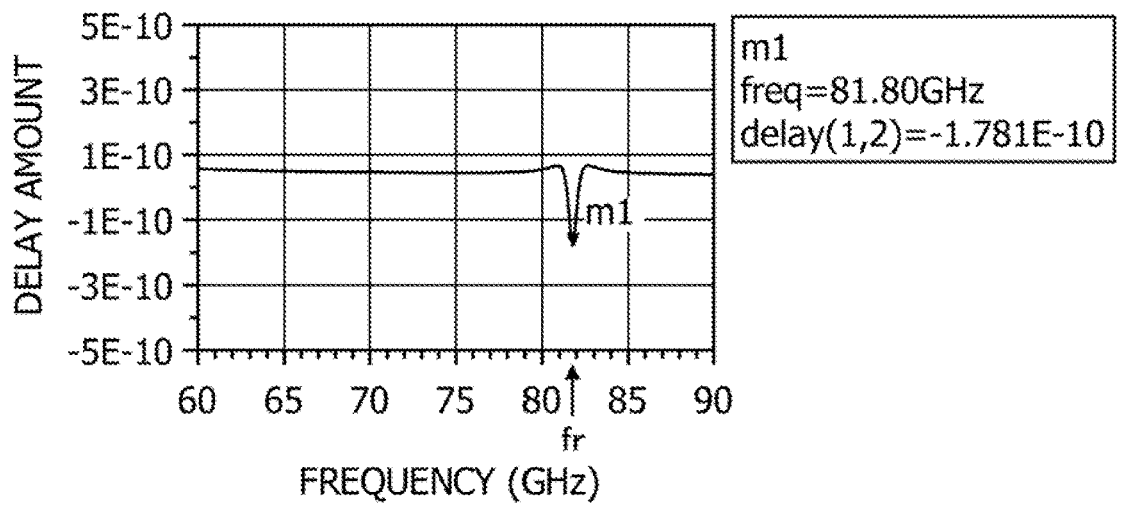
FIGS. 9A to 9C are diagrams illustrating the group delay characteristic with respect to the dimensions of the slot and the dielectric resonator.
Figure 9B:
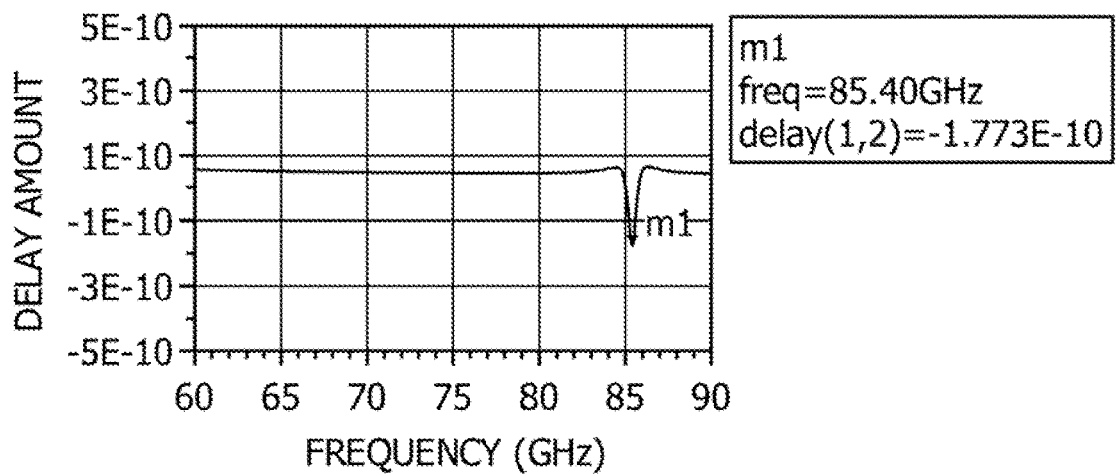
Figure 9C:
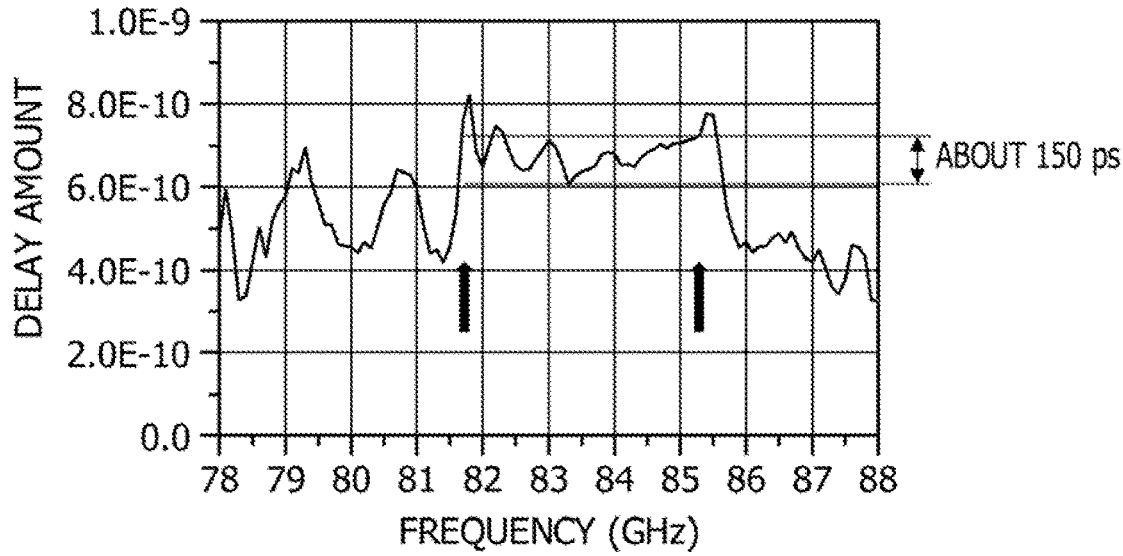

FIGS. 9A to 9C are diagrams illustrating group delay characteristics with respect to the dimensions of the slot 113 and the dielectric resonator 120. The characteristics illustrated in FIGS. 9A to 9C are obtained by changing each of the dimensions illustrated in FIG. 8 in the electromagnetic field simulation.

FIG. 9A illustrates results of simulation in which the dimensions are set as follows: HH=0.2 mm, HW=1.15 mm, HT=0.4 mm, RH=1.0 mm, RW=3.0 mm, and RT=2.0 mm. The relative dielectric constant of the dielectric resonator 120 is 2.8 and the dielectric loss tangent is 0.01. At this time, the resonance frequency fr of the dielectric resonator 120 is 81.8 GHz.

As illustrated in FIG. 9A, the negative group delay is obtained at the resonance frequency fr (81.8 GHz), and is about 250 ps. This value is suitable for compensation for the group delay of about 300 ps (see FIG. 2B) generated in the band-pass filter 13.

FIG. 9B illustrates results of simulation in which the dimensions are set as follows: HH=0.2 mm, HW=1.15 mm, HT=0.4 mm, RH=0.6 mm, RW=2.5 mm, and RT=1.98 mm. The resonance frequency fr of the dielectric resonator 120 is 85.4 GHz.

As illustrated in FIG. 9B, the negative group delay is obtained at the resonance frequency fr (85.4 GHz), and is about 240 ps. This value is suitable for compensation for the group delay of about 300 ps (see FIG. 2B) generated in the band-pass filter 13.

As described above, it is understood that, when the dimensions of the slots 113 and each of the portions of the dielectric resonator 120 are changed, the frequency at which the negative group delay is generated is adjustable. Furthermore, the delay amount of the negative group delay suitable for compensation for the group delay generated in the band-pass filter 13 and smaller than the delay amount of the negative group delay of the cavity resonator 70 illustrated in FIG. 4 is obtained. Thus, the frequency at which the negative group delay is generated is adjustable, and the delay amount of the comparatively small negative group delay is able to be obtained. The reason for this is that, when the dimensions of the slots 113 and each of the portions of the dielectric resonator 120 are changed, the Q factor of the group delay compensation filter 100 is adjustable.

FIG. 9C illustrates the group delay characteristic of the group delay compensation filter 100. In FIG. 9C, the horizontal axis represents the frequency (GHz) and the vertical axis represents the delay amount (delay time) due to the group delay of the group delay compensation filter 100.

Compared to a band at a central portion of the pass band, the delay amount of the group delay generated at bands at both ends of the pass band is about 150 ps. That is, the group delay is reduced to about a half of that illustrated in FIG. 2B. The delay amount of the group delay of 150 ps is obtained in the pass band of 81.8 GHz to 85.4 GHz (range indicated by two arrows in FIG. 9C) of the band-pass filter 13.

Thus, it is understood that, by adjusting the sizes of two slots 113, two dielectric resonators 120, and two openings 122 illustrated in FIGS. 6 and 7 and the positional relationships between two sets of the slots 113 and the openings 122 such as superposing states of two sets of the slots 113 and the openings 122, two frequency bands in which the negative group delay is able to be obtained are adjustable. For example, as an example, negative group delay is able to be set for 81.8 GHz with one of the dielectric resonators 120, and a negative group delay is able to be set for 85.4 GHz with the other dielectric resonator 120.

Figure 10A:
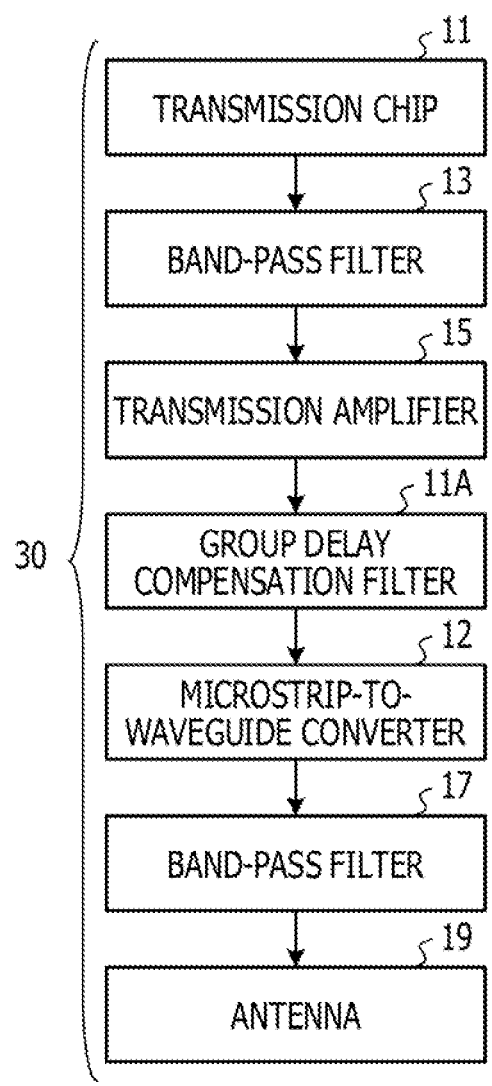
FIGS. 10A and 10B are block diagrams illustrating configurations of a comparative radio transmitter and a radio transmitter according to the embodiment.
Figure 10B:
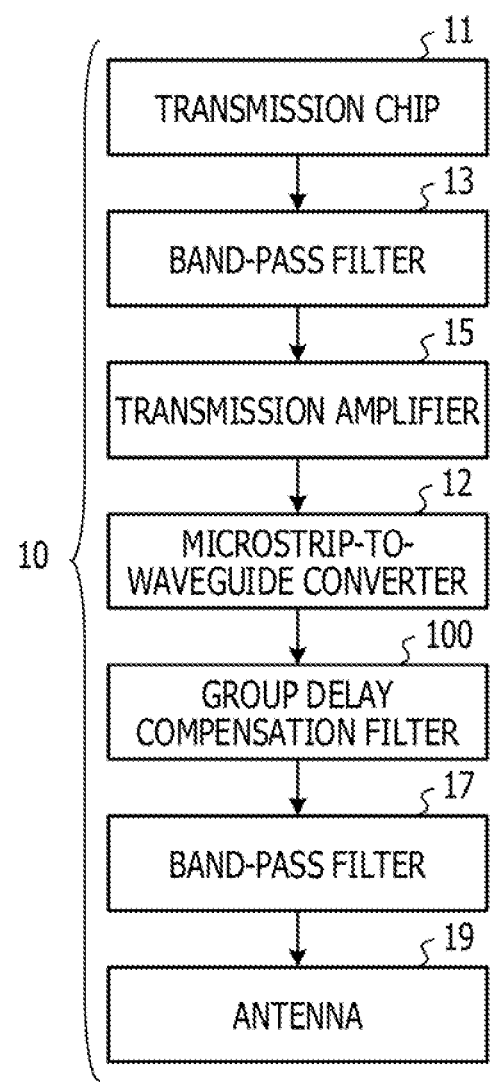

FIGS. 10A and 10B are block diagrams illustrating configurations of a comparative radio transmitter 30 and the radio transmitter 10 according to the embodiment. In FIGS. 10A and 10B, the elements included in the comparative radio transmitter 30 and the radio transmitter 10 according to the embodiment are indicated by blocks.

As illustrated in FIG. 10A, the comparative radio transmitter 30 includes the transmission chip 11, the band-pass filter 13, the transmission amplifier 15, a group delay compensation filter 11A, a microstrip-to-waveguide converter 12, the band-pass filter 17, and the antenna 19. Out of these, the transmission chip 11, the band-pass filter 13, the transmission amplifier 15, the band-pass filter 17, and the antenna 19 are similar to those illustrated in FIG. 1.

In the comparative radio transmitter 30, the group delay compensation filter 11A compensates the group delay and is realized by a circuit mounted on a printed circuit board. Thus, the group delay compensation filter 11A is provided between the transmission amplifier 15 and the microstrip-to-waveguide converter 12. The group delay compensation filter 11A performs, in advance, processing for compensating the group delay on the transmission signal output from the transmission amplifier 15 and outputs the processed signal to the microstrip-to-waveguide converter 12. The group delay compensation filter 11A and the microstrip-to-waveguide converter 12 are coupled to each other through a microstrip line.

The microstrip-to-waveguide converter 12 is provided between the group delay compensation filter 11A and the band-pass filter 17, converts the transmission signal output from the group delay compensation filter 11A into a waveguide-form transmission signal, and outputs the converted signal to the band-pass filter 17.

The band-pass filter 17 is provided between the microstrip-to-waveguide converter 12 and the antenna 19 and passes the components of the predetermined pass band in the millimeter waveband of the transmission signal output from the microstrip-to-waveguide converter 12 to output the passed signal to the antenna 19.

In contrast, as illustrated in FIG. 10B, the radio transmitter 10 according to the embodiment includes the transmission chip 11, the band-pass filter 13, the transmission amplifier 15, the microstrip-to-waveguide converter 12, the group delay compensation filter 100, the band-pass filter 17, and the antenna 19. Out of these, the transmission chip 11, the band-pass filter 13, the transmission amplifier 15, the band-pass filter 17, and the antenna 19 are similar to those illustrated in FIG. 1 and FIG. 10A.

In the radio transmitter 10 according to the embodiment, the microstrip-to-waveguide converter 12 is provided between the transmission amplifier 15 and the group delay compensation filter 100.

Thus, the transmission signal output from the transmission chip 11 passes through the band-pass filter 13, is amplified by the transmission amplifier 15, is converted into the waveguide-form transmission signal by the microstrip-to-waveguide converter 12, and is output to the group delay compensation filter 100. The group delay compensation filter 100 compensates the group delay characteristic included in the transmission signal input from the microstrip-to-waveguide converter 12, and the transmission signal the group delay characteristic of which has been compensated is output to the band-pass filter 17. The band-pass filter 17 passes the components of the predetermined pass band in the millimeter waveband of the transmission signal output from the group delay compensation filter 100 and outputs the components to the antenna 19.

Here, out of the elements of the comparative radio transmitter 30 and the radio transmitter 10 according to the embodiment, the microstrip-to-waveguide converter 12 may be an element that causes negative influence such as shifting of the band of the transmission signal.

Furthermore, the transmission signal transmitted through the comparative radio transmitter 30 and the radio transmitter 10 according to the embodiment is detectable on the output side of the waveguide but is not detectable on the output side of the printed circuit board, the microstrip line, and the like.

Accordingly, in the comparative radio transmitter 30, the transmission signal is detectable only on the output side of the band-pass filter 17. Furthermore, the transmission signal becomes influenced by the microstrip-to-waveguide converter 12. Thus, it is not easy to accurately compensate the group delay characteristic.

In contrast, in the radio transmitter 10 according to the embodiment, the transmission signal is detectable on the output side of the microstrip-to-waveguide converter 12 and the output side of the band-pass filter 17. The output of the band-pass filter 17 is a signal the group delay of which has been compensated by the group delay compensation filter 100.

Thus, based on the transmission signal detected on the output side of the microstrip-to-waveguide converter 12 and the transmission signal detected on the output side of the band-pass filter 17, the compensation characteristic of the group delay compensation filter 100 for the group delay is adjustable while removing the influence of the microstrip-to-waveguide converter 12. Thus, the group delay characteristic may be accurately compensated.

As described above, according to the embodiment, the waveguide 110 has the slots 113 and the group delay compensation filter 100 has the dielectric resonators 120 having the openings 122 coupled to the slots 113. Accordingly, the group delay characteristic of the transmission signal may be easily compensated with a comparatively simple configuration.

Accordingly, the group delay compensation filter 100 able to compensate the group delay is able to be provided. For example, the group delay compensation filter 100, which may easily compensate the group delay characteristic of the transmission signal with a comparatively simple configuration, is able to be provided.

Here, when compensating the group delay, there exists a technique in which a signal processing circuit such as a digital signal processor (DSP) is used. However, such a technique may require power to compensate the group delay.

In contrast, the group delay compensation filter 100 according to the embodiment is able to compensate the group delay characteristic with the configuration in which the dielectric resonators 120 are added to the waveguide 110. Accordingly, the power for operating the elements for compensation for the group delay may not be required. Thus, according to the embodiment, the group delay compensation filter 100, which is able to compensate the group delay without power consumption or with a minimum power consumption, is able to be provided.

Furthermore, as has been described with reference to FIG. 10B, the group delay compensation filter 100 is able to compensate the group delay characteristic with the configuration in which the dielectric resonators 120 are added to the waveguide 110. Accordingly, the compensation characteristic for the group delay is adjustable while removing the influence of the microstrip-to-waveguide converter 12. Thus, according to the embodiment, the group delay compensation filter 100, which may accurately compensate the group delay, is able to be provided.

Furthermore, the coupling amount between the waveguide 110 and the dielectric resonator 120 is adjustable by preparing the plurality of dielectric resonators 120 the openings 122 of which are different in size and replacing the dielectric resonators 120. In the case of the comparative radio transmitter 30, the group delay compensation filter 11A may be required to be adjusted through, for example, wire bonding. Thus, the work efficiency of the adjustment work is very bad.

In contrast, in the case of the radio transmitter 10 including the group delay compensation filter 100, the efficiency of the adjustment work may be significantly improved.

Although a configuration in which the group delay compensation filter 100 includes two dielectric resonators 120 has been described above, the group delay compensation filter 100 may include a single dielectric resonator 120. In this case, a configuration in which one of the group delay on the low frequency side of the pass band and the group delay on the high frequency side of the pass band is compensated may be provided.

Although the group delay compensation filter 100 having been described above transmits millimeter waves, this is not limiting. For example, the sizes of each of the elements may be changed so as to transmit microwaves.

Although a configuration in which the band-pass filter 13 is disposed between the transmission chip 11 and the group delay compensation filter 100 has been described above, the band-pass filter 13 may be disposed between the group delay compensation filter 100 and the transmission amplifier 15.

Although a configuration in which the group delay compensation filter 100 is included in the radio transmitter 10 has been described above, the group delay compensation filter 100 may be included in the radio receiver to compensate group delay of a reception signal. Instead of the radio transmitter 10 or a radio receiver, a signal processing device that processes a signal may include the group delay compensation filter 100 to compensate group delay.

Figure 11:
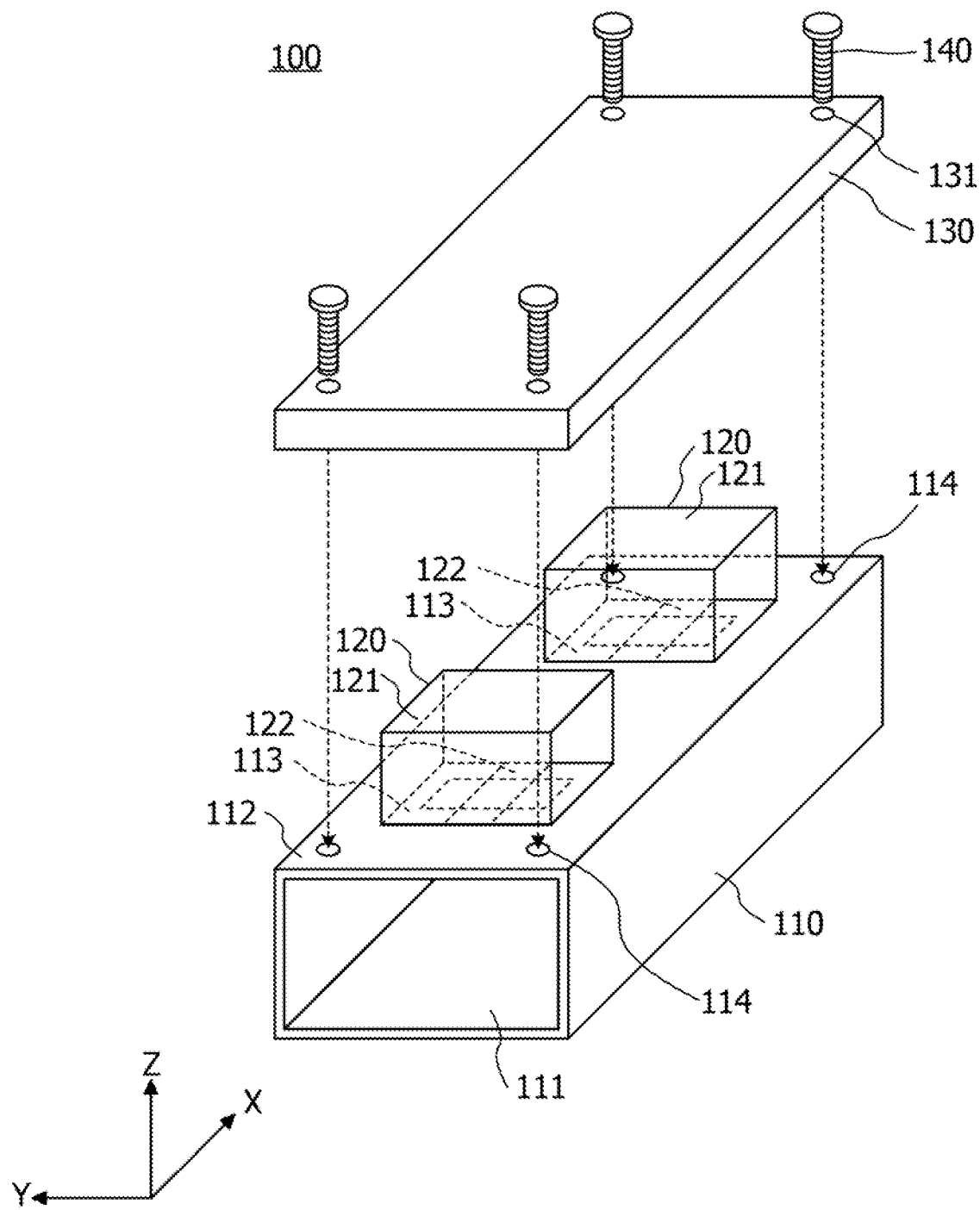
FIG. 11 illustrates the group delay compensation filter.

The waveguide 110 and the dielectric resonators 120 are able to be secured in a structure as illustrated in FIG. 11. FIG. 11 illustrates the group delay compensation filter 100. The group delay compensation filter 100 includes, in addition to the waveguide 110 and the dielectric resonators 120, a securing plate 130 and screws 140.

Referring to FIG. 11, in the waveguide 110, the wall portion 112 has threaded holes 114 at the four corners, and the securing plate 130 has through holes 131 corresponding to the threaded holes. 114. The waveguide 110 and the dielectric resonators 120 are able to be secured in a desired positional relationship by, with the waveguide 110 and the dielectric resonators 120 aligned with one another, damping the dielectric resonators 120 with the waveguide 110 and the securing plate 130, inserting the screws 140 through the through holes 131, and fastening the screws 140 to the threaded holes 114. Furthermore, with such a structure, the coupling amount between the waveguide 110 and the dielectric resonators 120 may be easily adjusted by replacing the dielectric resonators 120. Further, fine adjustment of the positions of the waveguide 110 and the dielectric resonators 120 may be easily performed.

The structure for securing the waveguide 110 and the dielectric resonators 120 illustrated in FIG. 11 is exemplary. The waveguide 110 and the dielectric resonators 120 are able to be secured by any of various other structures.

Figure 12:
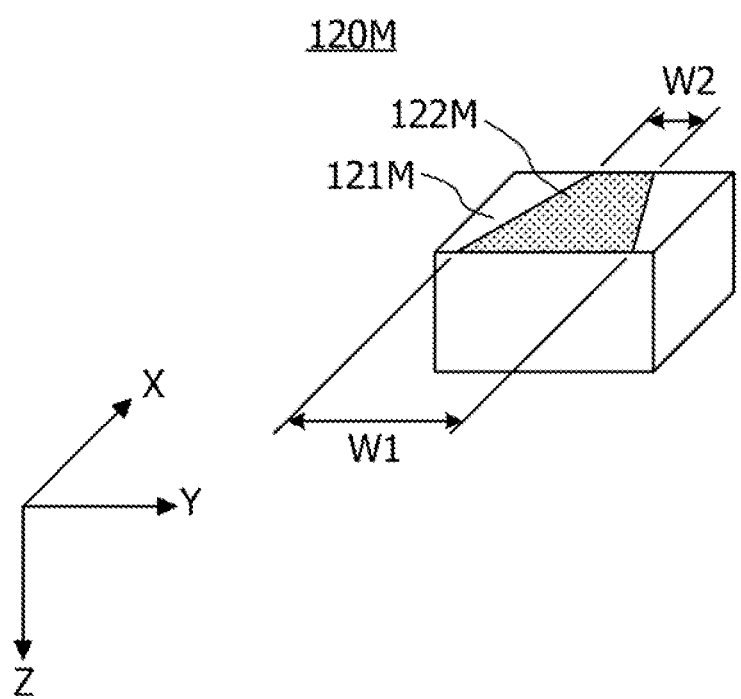
FIG. 12 is a diagram illustrating a dielectric resonator according to a variant of the embodiment.

FIG. 12 is a diagram illustrating a dielectric resonator 120M according to a variant of the embodiment. The dielectric resonator 120M has an opening 122M having a tapered shape (trapezoidal shape) in XY plan view. The width of the opening 122M varies from W1 to W2 (<W1). When such a dielectric resonator 120M is moved in the X-axis direction relative to the slot 113, the length, in the Y-axis direction, of a portion of the opening 122M superposed on the slot 113 may be easily adjusted. Accordingly, the compensation characteristic for the group delay may be easily adjusted.

Here, a configuration in which the dielectric resonator 120M has the taper-shaped opening 122M has been described above. However, the shape of the opening 122M may be a shape other than the tapered shape such as a triangle or a circle.

Figure 13A:
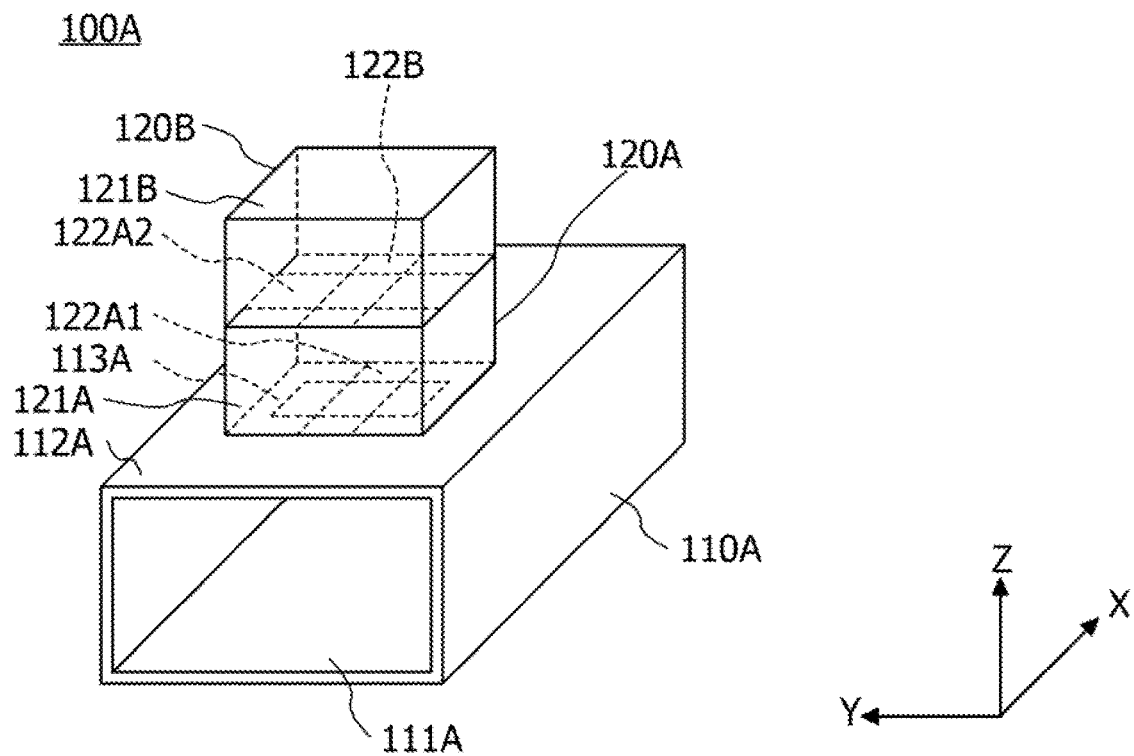
FIGS. 13A and 13B are diagrams illustrating a group delay compensation filter according to a variant of the embodiment.
Figure 13B:
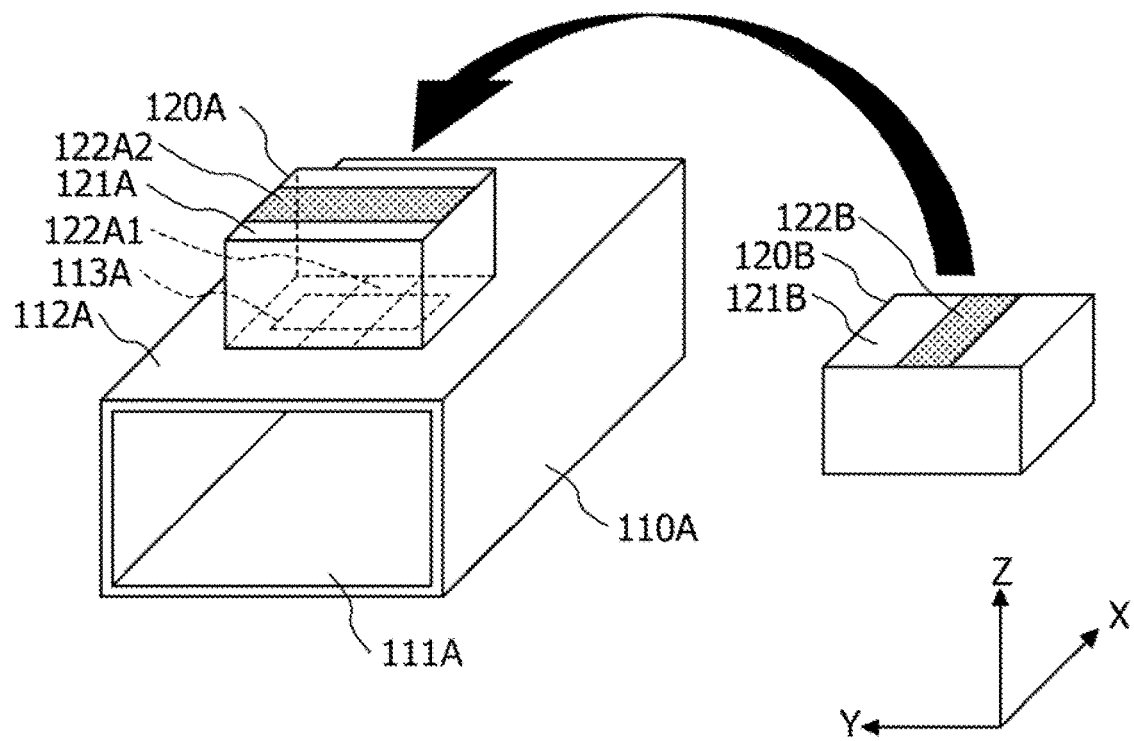

FIGS. 13A and 13B are diagrams illustrating a group delay compensation filter 100A according to a variant of the embodiment. The group delay compensation filter 100A includes a waveguide 110A and dielectric resonators 120A, 120B. The dielectric resonators 120A, 120B are examples of the first dielectric resonator and the second dielectric resonator, respectively.

The waveguide 110A has openings 111A at both ends in the X-axis direction and a single slot 113A in a wall portion 112A on the positive side in the Z-axis direction. The length of the waveguide 110A in the X-axis direction may be smaller than the length of the waveguide 110 illustrated in FIGS. 6 and 7.

The dielectric resonator 120A has openings 122A1, 122A2, and a metal plated layer 121A is formed in portions other than the openings 122A1, 122A2. The opening 122A1 is similar to the openings 122 of the dielectric resonator 120 illustrated in FIGS. 6 and 7. The opening 122A2 is provided in the surface on the positive side in the Z-axis direction. For example, the opening 122A1 and the opening 122A2 face each other. In XY plan view, the opening 122A2 is arranged differently with respect to the opening 122A1 by 90 degrees. The openings 122A1, 122A2 are respectively examples of the first opening and the second opening.

The dielectric resonator 120B is similar to the dielectric resonators 120 illustrated in FIGS. 6 and 7, and a metal plated layer 121B is formed on the surfaces other than an opening 122B. The opening 122B is an example of a third opening.

The group delay compensation filter 100A is structured such that the dielectric resonator 120A is superposed on the waveguide 110A with the slot 113A and the opening 122A1 aligned with each other, and further, the dielectric resonator 120B is superposed on the dielectric resonator 120A with the opening 122A2 and the opening 122B aligned with each other.

The slot 113A and the opening 122A1 are perpendicular to each other in XY plan view. Also, the opening 122A2 and the opening 122B are perpendicular to each other in XY plan view.

By adjusting the sizes and superposing states of the slot 113A, the dielectric resonators 120A, 120B, the openings 122A1, 122A2, and the opening 122B, two frequency bands of the negative group delay obtained by dielectric resonators 120A, 120B are adjustable.

By adjusting the sizes and either or both of the positions and orientations of the slot 113A, the openings 122A1, 122A2, and the opening 122B, the Q factor of the group delay compensation filter 100A is adjustable, and the compensation amount and the frequency of the group delay are adjustable.

Figure 14:
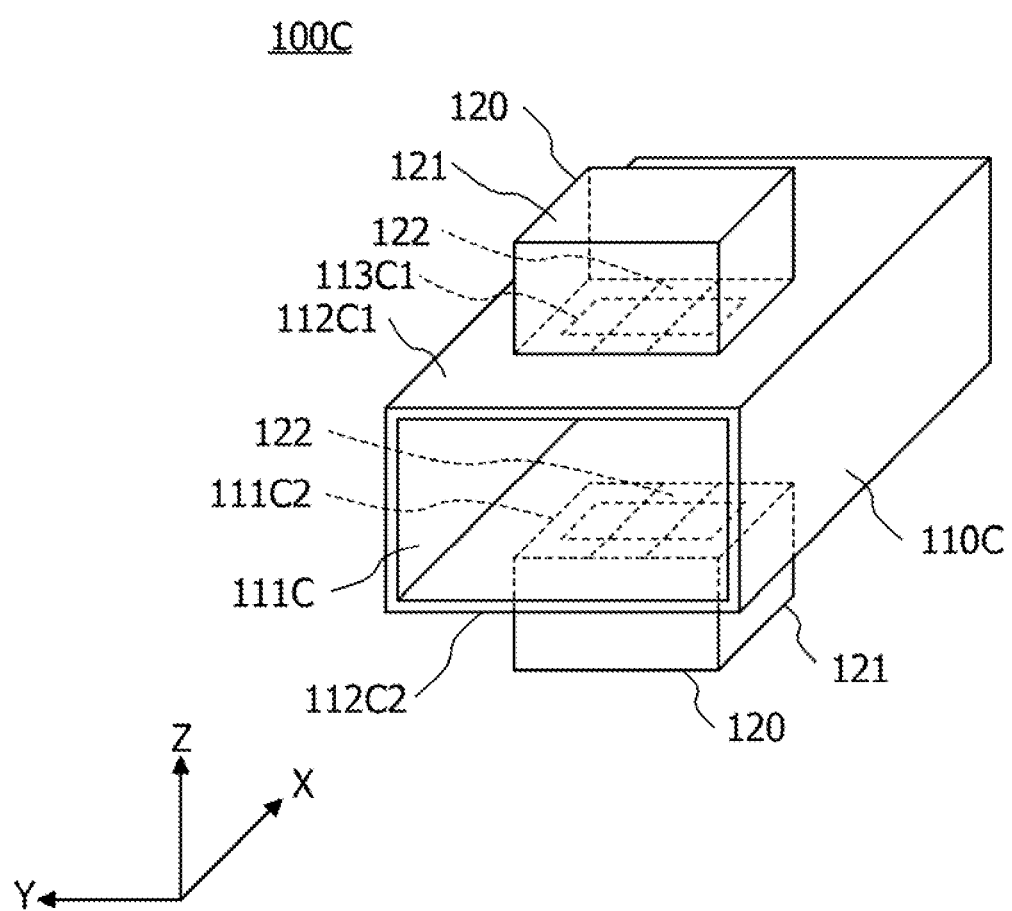
FIG. 14 is a diagram illustrating a group delay compensation filter according to a variant of the embodiment.

FIG. 14 is a diagram illustrating a group delay compensation filter 100C according to a variant of the embodiment. The group delay compensation filter 100C includes a waveguide 110C and two dielectric resonators 120.

The waveguide 110C has openings 111C at both ends in the X-axis direction and slots 113C1, 113C2 in wall portions 112C1, 112C2 on the positive and negative sides in the Z-axis direction, respectively. The length of the waveguide 110C in the X-axis direction may be smaller than the length of the waveguide 110 illustrated in FIGS. 6 and 7.

Two dielectric resonators 120 have a similar structure to that of the dielectric resonators 120 illustrated in FIGS. 6 and 7.

When securing the dielectric resonators 120 to the waveguide 110C, it is sufficient that the slot 113C1 in the wall portion 112C1 of the waveguide 110C be aligned with the opening 122 of one of the dielectric resonators 120 on the positive side in the Z-axis direction, and the slot 113C2 of the wall portion 112C2 of the waveguide 110C be aligned with the opening 122 of the other dielectric resonators 120 on the negative side in the Z-axis direction.

By setting the sizes of the dielectric resonators 120, the slots 113C1, 113C2, and the openings 122 on the positive and negative sides in the Z-axis direction and setting the positional relationships between the slots 113C1, 113C2 and the openings 122 on the positive and negative sides in the Z-axis direction, the compensation amount and the frequency of two negative group delays obtained by two dielectric resonators 120 are adjustable. Above, although the transmission filter according to the exemplary embodiment has been described, the embodiment is not limited to the disclosed exemplary embodiment, and various modifications and variations are possible without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A group delay compensation filter comprising:
a waveguide that has a first slot and that is configured to transmit a signal; and
a first dielectric resonator that includes:
a first dielectric,
a first metal layer formed over a surface of the first dielectric, and a first opening provided in the first metal layer, wherein
the first dielectric resonator is in contact with the waveguide with the first opening coupled to the first slot, and wherein
the first dielectric resonator is configured to compensate group delay in a first frequency band of the signal.
2. The group delay compensation filter according to claim 1, wherein
the first dielectric resonator has a rejection band in the first frequency band.
3. The group delay compensation filter according to claim 1, wherein
the waveguide further includes a second slot, wherein
the group delay compensation filter further includes a second dielectric resonator that includes:
a second dielectric,
a second metal layer formed over a surface of the second dielectric, and a second opening provided in the second metal layer, wherein
the second dielectric resonator is in contact with the waveguide with the second opening coupled to the second slot, and wherein
the second dielectric resonator is configured to compensate group delay in a second frequency band of the signal.

4. The group delay compensation filter according to claim 3, wherein
the first slot and the second slot are spaced from each other in a waveguide axis direction of the waveguide.

5. The group delay compensation filter according to claim 3, wherein
the first slot and the second slot face each other with a waveguide axis of the waveguide interposed between the first slot and the second slot.

6. The group delay compensation filter according to claim 1, wherein
the first dielectric resonator further has a second opening provided at a position which faces the first opening of the first metal layer, wherein
the group delay compensation filter further includes a second dielectric resonator that includes:
a second dielectric,
a second metal layer formed over a surface of the second dielectric, and
a third opening provided in the second metal layer, wherein
the second dielectric resonator is in contact with the first dielectric resonator with the third opening coupled to the second opening, and wherein
the second dielectric resonator is configured to compensate group delay in a second frequency band of the signal.

7. The group delay compensation filter according to claim 3, wherein
the second dielectric resonator has a rejection band in the second frequency band.

8. The group delay compensation filter according to claim 1, wherein
the group delay is generated at an end portion of a pass band of a band-pass filter.

* * * * *